(12) United States Patent
Kruwinus

(10) Patent No.: US 6,385,863 B1
(45) Date of Patent: May 14, 2002

(54) PROCESS AND DEVICE FOR DRYING DISK-LIKE OBJECTS

(75) Inventor: Hans-Jurgen Kruwinus, Bodensdorf (AT)

(73) Assignee: SEZ Semiconductor-Equipment Zubenor fur die Habbleiterfertigung, Villach (AT)

( * ) Notice: Subject to any disclaimer, the term of this patent is extended or adjusted under 35 U.S.C. 154(b) by 0 days.

(21) Appl. No.: 09/586,762

(22) Filed: Jun. 5, 2000

(30) Foreign Application Priority Data

Jun. 4, 1999 (AT) ................................. 1002/99

(51) Int. Cl.⁷ ................................................ F26B 7/00
(52) U.S. Cl. ........................................... 34/443; 134/31
(58) Field of Search ........................... 34/58, 315, 443, 34/516; 134/25.4, 31

(56) References Cited

U.S. PATENT DOCUMENTS

| | | | |
|---|---|---|---|
| 4,637,146 A | * | 1/1987 | Motoki et al. ................. 34/58 |
| 5,255,445 A | * | 10/1993 | Li et al. ........................ 34/443 |
| 5,271,774 A | | 12/1993 | Leenaars et al. |
| 5,571,337 A | * | 11/1996 | Mohindra et al. ......... 134/25.4 |
| 5,714,203 A | | 2/1998 | Schellenberger et al. |
| 5,882,433 A | * | 3/1999 | Ueno ........................... 134/31 |
| 6,029,371 A | * | 2/2000 | Kamikawa et al. ........... 34/516 |
| 6,122,837 A | * | 9/2000 | Olesen et al. ................. 34/315 |
| 6,199,298 B1 | * | 3/2001 | Bergman ...................... 34/315 |

FOREIGN PATENT DOCUMENTS

| | | | | |
|---|---|---|---|---|
| DE | 42 36 478 A1 | | 5/1994 | |
| EP | 0878832 A2 | | 11/1998 | |
| EP | 0905747 A1 | | 3/1999 | |
| JP | 9162156 A | | 6/1997 | |
| JP | 411016875 | * | 1/1999 | .......... H01I/21/304 |
| JP | WO99/14801 | * | 3/1999 | .......... H01L/21/304 |

* cited by examiner

Primary Examiner—Teresa Walberg
Assistant Examiner—Leonid Fastovsky
(74) Attorney, Agent, or Firm—Young & Thompson

(57) ABSTRACT

A process for producing a drying gas for drying one or more disk-like objects, in which a carrier gas and an active substance are mixed, as well as a drying process that uses the drying gas that is produced in this manner. Also, a drying-gas production device that is suitable for mixing a carrier gas and an active substance.

29 Claims, 1 Drawing Sheet

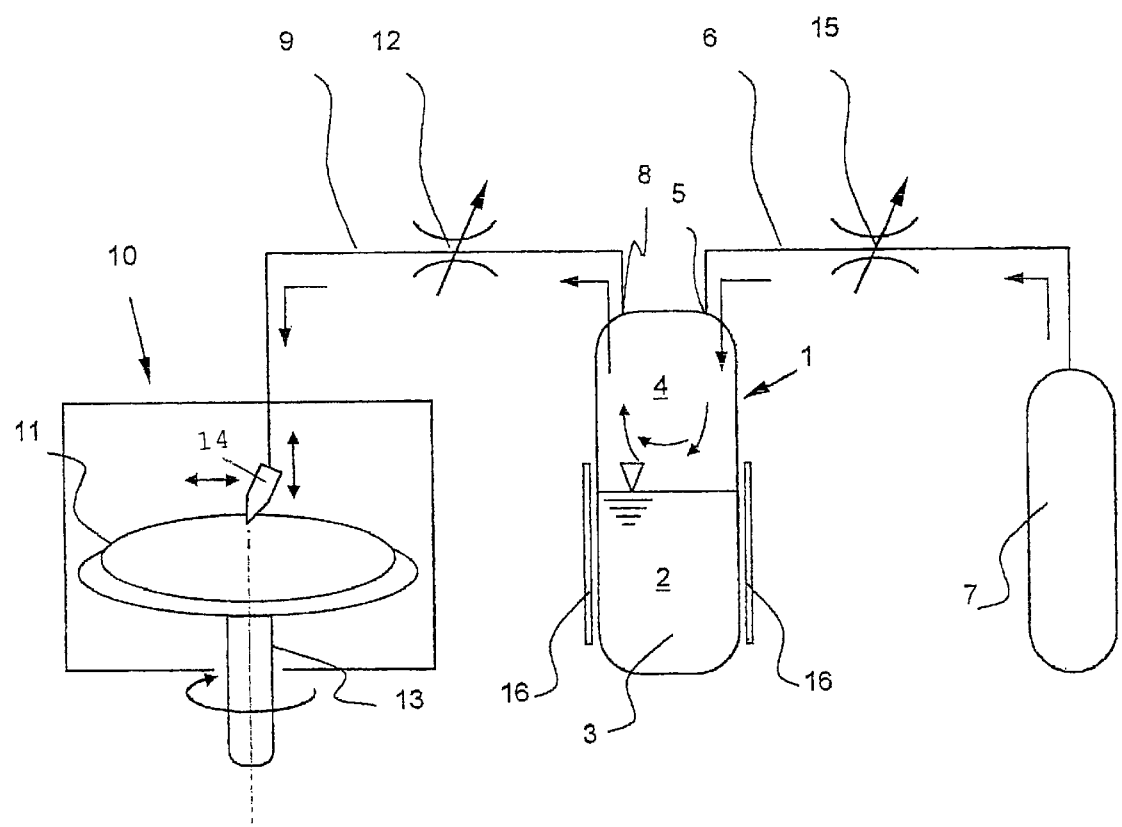

PROCESS AND DEVICE FOR DRYING DISK-LIKE OBJECTS

The invention pertains to a process and the device for producing a drying gas for drying and the drying of disk-like objects, especially semiconductor substrates such as silicon wafers and gallium-arsenide wafers, but also glass and quartz substrates, metal substrates, flat-panel displays, and compact disks.

The invention focuses in particular on the drying of semiconductor disks (wafers) such as silicon wafers and semiconductor wafers based on gallium arsenide.

A particular disadvantage in the drying of silicon wafers is the fact that during the drying process a build-up of particles occurs that is harmful to the semiconductor wafer, i.e., the wafer can no longer be dried without residue.

In the case of silicon wafers, the reason for the above-mentioned disadvantageous particle formation is that in the presence of oxygen (e.g., from the air) water reacts with silicon to form silicon dioxide. These particles are also called water marks.

U.S. Pat. No. 5,271,744 A and EP 0 905 746 A1 each describe a process for removing liquids from the surface of a disk-like object. In the case of both documents, the drying of disk-like objects is done by blowing a drying gas onto the surface of the disk-like object. The drying gas contains a carrier gas and an active substance, and the disk-like object rotates around its axis as the drying gas is being blown onto it.

U.S. Pat. No. 5,271,774 A describes a process for producing a corresponding drying gas in which the carrier gas is bubbled through the liquid active substance that is provided.

JP 09-162156 A describes a device for cleaning and drying semiconductor wafers with a drying gas that is produced by heating a solvent.

EP 0878832 A2 describes a process and a device for drying semiconductor wafers with a drying gas that is produced by mixing a carrier gas with a liquid. In this case the mixing is done with a nozzle.

The object of the invention is to remove as quickly as possible liquid residue, especially residue of deionized water, that may be present from preceding processing steps on the surface of the disk-like object, especially the silicon wafer, so that little or none of the above-mentioned particle formation takes place, and to do so with a process for treating individual disk-like objects.

Accordingly, in its most general embodiment the invention proposes a process for producing a drying gas for drying one or more disk-like objects in which a carrier gas and an active substance are mixed. The drying gas is produced by causing the carrier gas to come into contact with the still, liquid surface of the active substance. In this process the carrier gas is enriched to some extent with gas of the active substance that is located above the liquid.

This has the advantage that there cannot be any droplets of liquid of the active substance in the drying gas and therefore there can be no mist; this makes the drying more uniform.

By mixing a carrier gas with an active substance, a concentration can be selected at which, even if at operating temperature the active substance can form combustible or explosive mixtures with air, no combustible or explosive mixtures can develop.

If the partial pressure of the carrier gas is selected to be above normal pressure when it comes into contact with the liquid active substance, then with the partial pressure of the active substance being the same, the proportion of active substance in the drying gas decreases. In this embodiment, before the drying gas is brought into contact with the surface of the disk-like object, the pressure of the gas is reduced. When the carrier gas comes into contact with the liquid active substance, an advantageous carrier-gas partial pressure lies in the range of 1.5–7 bar (e.g., 3–4 bar).

In an embodiment of the invention, the partial pressure of the active substance in the drying gas is less than 20% of the saturation vapor pressure since this keeps the consumption of the active substance low and further increasing the concentration provides for very little improvement in the effect.

Even in cases where the partial pressure of the active substance in the drying gas was less than 5% of the saturation vapor pressure, good results were achieved. Such a low partial pressure has the advantage that in the case of combustible active substances no explosive gas mixtures can form if an inert gas is selected as a carrier gas.

In one embodiment the partial pressure of the active substance in the drying gas is a 0.01–10 hPa (whereby the total pressure is 1000 Hpa); this corresponds to a concentration of between 0.001 and 1 vol %. This has advantages not only from the standpoint of the environment, but also in terms of efficiency and safety.

If the active substance in the drying gas is selected in such a way that the liquid wets the surface of the object better, then droplets that may adhere to the surface can run off since they are induced to form as large a common boundary area with the surface of the disk-shaped object as possible.

In order to achieve the desired effect, the active substance used in the process can be selected in such a way that it reduces the surface tension of the liquid that is to be removed from the disk-like object by drying.

These substances should be understood to include not just surfactants in the classical sense (wetting agents and tensides). other organic or inorganic substances that have considerably shorter chains can be used as well. A common feature of all the these substances is the fact that their molecules have a polar (hydrophilic or lipophobic) part and an apolar (hydrophobic or lipophilic) part.

In this way it becomes possible for polar solvents (e.g., water) to wet apolar (hydrophobic) surfaces (e.g., elementary silicon). By the same token, apolar solvents (petroleum ethers) can wet polar surfaces (silicon dioxide).

An advantageous active substance is an organic solvent. Liquids that have a saturation vapor pressure at room temperature (25° C.) of 0.5–200 hPa have been found to be highly suitable active substances. Thus, the partial pressure of the active substance in the drying gas can be produced by evaporating the liquid.

If water is to be dried off of the disk-like object, it is advantageous for the active substance to have a solubility in water of at least 1 g/l so that it can exert its action on the wetting behavior of the water.

A solubility in water of at least 10 g/l has proven to be advantageous.

The active substance can be selected from the group silanols (e.g., triethyl silanol, trimethyl silanol), alcohols (e.g., ethanol, propanol), esters (e.g., ethyl acetate), ketones (e.g., acetone), and aldehydes and amides (e.g., dimethyl-formamide DMF).

An advantageous active substance is an alcohol, whereby longer-chain alcohols (n-hexanol) have the advantage of more effectively promoting wetting and whereby shorter-chain (ethanol) alcohols desorb from the surface more readily. Highly suitable is 2-propanol because it combines both advantages.

Of course, any other mixtures of the active substances can also be used.

The carrier gas of the drying gas may be an inert gas such as, e.g., nitrogen. Mixing the active substance with an inert gas makes it possible to prevent mixtures that are combustible or explosive with the ambient air from forming.

Another part of the invention is a process for drying disk-like objects by blowing onto the disk-like object's surface a drying gas that is produced according to one of the above-described processes. While the drying gas is being blown onto it, the disk-like object rotates around its axis.

On the one hand, the rotation of the disk-like object is advantageous for treating the surface with the drying gas as uniformly as possible and at the same time minimizing the consumption of drying gas. On the other hand, a high shearing speed and, accordingly, a small diffusion layer in the gaseous phase greatly increase the evaporation rate.

In one embodiment, the volume flow of the drying gas as it is blown onto the surface of the disk-like object is 10–100 l/min, whereby the volume flow is measured at normal pressure (1000 hPa). This ensures a high flow rate directly on the surface and thus faster drying.

The time for which the disk-like object is treated with the drying gas is 3–30 seconds in the case of one embodiment of the process. Such a treatment time is advantageous in terms of drying results and efficiency.

It is advantageous for the speed of rotation to be selected within the range of 100–10,000 rpm. Good results are obtained in the range of 500–3000 rpm.

In one embodiment of the process according to the invention, the drying gas is blown onto the disk-like object starting in the center of the object as the disk-like object is being rotated, then proceeding to the peripheral edge of the object.

This ensures that any liquid droplets that flow off cannot run off over parts of the surface that have already been dried.

For example, in some areas (in spots) the drying gas is applied to the disk-like object, and then in succession all areas of the surface of the disk-like object are covered.

The drying process can be part of a process for treating disk-like objects with liquids, in which process the last liquid is a flushing liquid (e.g., deionized water) and this latter liquid is removed from the surface of the disk-like object by one of the above-described drying processes.

This process can be a cleaning process, an etching process, a process for developing or removing photoresists, or a combination of these processes. The important thing is that the last treatment liquid (cleaning solution or etching solution) be removed by a flushing liquid. The drying step can immediately follow the flushing step, or the majority of the flushing liquid can be driven off before the drying step begins.

In one embodiment of this process, the disk-like object rotates around its axis during all liquid treatment steps.

Another part of the invention is a drying gas device production that is suitable for mixing a carrier gas and an active substance together. To produce the drying gas, this device consists of a container 1 with a first lower area 2 to receive active substance 3 and a second upper area 4. One opening 5 in container 1 is connected via a first line 6 to a gas source 7 for the carrier gas, and another opening 8 is connected via a second line 9 to location 10 wherein the drying gas comes into contact with the surface of disk-like object(s) 11. Both openings 5 and 8 are located in second upper area 4 of container 1.

This makes it possible to mix the drying gas just before it is used and prevents non-gaseous parts of active substance 3 from being entrained in the drying gas. Moreover, the consumption of active substance 3 can be kept low since only already evaporated active substance 3 can build up in the drying gas.

Gas source 7 for the carrier gas can be a compressed-gas line or a glass bottle under pressure. The pressure of the carrier gas between the gas source and a device for producing the drying gas can be reduced by a reducing valve 15.

In another embodiment of the invention, a reducing valve 12 is located in line 9 between the device for producing the drying gas and location 10 where the drying gas comes into contact with the surface of disk-like object 11. This makes it possible to ensure that an overpressure prevails in the device, meaning that the active-substance concentration at nozzle 14 is reduced.

In order to make the production of the drying gas uniform, the device can be kept at a constant temperature (heating 16). This may be appropriate when, for example, the temperatures of the carrier gas and the active substance 3 can vary before they are brought together.

Another part of the invention is a device for drying disk-like objects with a rotating carrier 13 to support a disklike object 11 and with a nozzle 14 for blowing drying gas onto the surface of disk-like object 7. Nozzle 14 is connected via a line 9 to a device for producing the drying gas.

With its mouth, the outlet of nozzle 14 is directed onto the surface of disk-like object 11, an angle of 20–90°.

In one embodiment of the device, nozzle 14 can be moved some distance away from the surface of disk-like object 11 and parallel to the surface of said object, thus making it possible to blow the drying gas onto any area of the surface of the disklike object as said object is being rotated. This is also a reasonable step for ensuring that nozzle 14 can be removed for other processing steps and is removed when disk-like object 11 is loaded onto and removed from support 13.

The distance between the mouth of nozzle 14 and the surface of disk-like object 11 in this case can be 2–50 mm.

Further details, features, and advantages of the invention will be found in the following description of the embodiments of the invention.

In Example 1, after being cleaned with hydrogen peroxide and ammonia, the surface of a silicon wafer on which the structures are located is flushed with deionized water while the wafer rotates at 500 rpm. Then the flushing liquid is spun off at 2000 rpm. At a rotation speed of 1000, a drying gas is now used to blow off the wafer surface for 10 seconds. In this case the drying gas is applied with a nozzle that is moved parallel to the wafer surface and some distance (5 mm) from it. The nozzle moves from the center of the wafer (which is also the center of rotation) at a uniform speed during the 10 seconds that it takes to reach the circumferential edge of the wafer. 2-propanol with a partial pressure in the drying gas of 0.1 hPa is used as an active substance in the drying gas, and the carrier gas is nitrogen. The flow rate of the drying gas is 60 l/min.

The drying gas is produced in container in which the 2-propanol is provided, at a temperature of 20° C. The container is filled about halfway. Nitrogen flows in through an opening in the cover of the container, and the drying gas escapes through another opening in the cover of the container. The nitrogen spreads with a partial pressure of 6 bar over the still surface of the liquid. During operation the partial pressure of the 2-propanol is 0.6 hPa (i.e., approximately 1.3% of the saturation pressure of 45 hPa). The pressurized drying gas henceforth has a total pressure of 6000.6 hPa, and therefore after the pressure of the drying gas is reduced to normal pressure (1000 hPa), a partial pressure of 0.1 hPa results at the nozzle.

Example 2 is based on Example 1, but in this case the drying takes place after a rear-side etching process during which a layer of silicon dioxide has been removed. Drying takes place immediately after flushing with deionized water without spinning off as an intermediate step, i.e., the residual water is removed right during the five-second application of the drying gas, at a rotation speed of 1500 rpm.

2-propanol with a partial pressure in the drying gas of 0.4 hPa is used as the active substance in the drying gas, and the carrier gas is nitrogen. The flow rate of the drying gas is 80 l/min.

The 2-propanol is supplied at a temperature of 30° C. The nitrogen spreads with a partial pressure of 2 bar over the still surface of the liquid. During operation the partial pressure of the 2-propanol is 0.8 hPa (i.e., approximately 1% of the saturation pressure of 83 hPa). The pressurized drying gas henceforth has a total pressure of 2000.8 hPa, and therefore after the pressure of the drying gas is reduced to normal pressure (1000 hPa), a partial pressure of 0.4 hPa results at the nozzle.

What is claimed is:

1. Process for the production of a drying gas for drying one or more disk-like objects, in which a carrier gas and an active substance are mixed, wherein the carrier gas comes into contact with the still surface of the liquid and in so doing becomes enriched with the gas of the active substance located above the liquid.

2. Process according to claim 1, wherein a partial pressure of the carrier gas when the carrier gas comes into contact with the liquid active substance exceeds normal pressure and, before the drying gas is brought into contact with the surface of the disk-like object, the pressure of the drying gas is reduced.

3. Process according to claim 1, wherein the partial pressure of the active substance in the drying gas is less than 20% of the saturation vapor pressure.

4. Process according to claim 3, wherein the partial pressure of the active substance in the drying gas is less than 5% of the saturation vapor pressure.

5. Process according to claim 1, wherein the partial pressure of the active substance in the drying gas is 0.01–10 hPa (at an overall pressure of 1000 hPa).

6. Process according to claim 1, wherein the active substance affects the liquid that is to be dried off of the disk-like object in such a way that the liquid better wets the surface of the disk-like object to be dried.

7. Process according to claim 1, wherein the active substance reduces the surface tension of the liquid that is to be dried off of the disk-like object.

8. Process according to claim 1, wherein the active substance is an organic solvent.

9. Process according to claim 1, wherein the active substance is a liquid that has a saturation vapor pressure at room temperature (25° C.) of 0.5–200 hPa.

10. Process according to claim 1, wherein the active substance has a solubility in water of at least 1 g/l.

11. Process according to claim 10, wherein the active substance has a solubility in water of at least 10 g/l.

12. Process according to claim 1, wherein the active substance is selected from the group alcohols, silanols, esters, ketones, aldehydes, and amides.

13. Process according to claim 12, wherein the active substance is an alcohol.

14. Process according to claim 13, wherein the active substance is 2-propanol.

15. Process according to claim 1, wherein the carrier gas is an inert gas.

16. Process according to claim 15, wherein the carrier gas is nitrogen.

17. Process for drying disk-like objects by blowing onto the disk-like object's surface a drying gas produced according to claim 1, wherein the disk-like object rotates around its axis as the drying gas is blown onto it.

18. Process according to claim 17, wherein when the gas is being blown onto the surface of the disk-like object, the volume flow of the drying gas is 10–100 l/min.

19. Process according to claim 17, wherein the time for which the disk-like object is treated with the drying gas is 3–30 seconds.

20. Process according to claim 17, wherein the speed of rotation is selected to be a range of 100–10,000 rpm.

21. Process according to claim 17, wherein the blowing of the drying gas starts in the center of the disk-shaped object's surface as the disk-shaped object is being rotated and then moves to the peripheral edge of the disk-shaped object.

22. Process according to claim 17, wherein the drying gas is applied to the disk-like object in certain areas (in spots) and then all parts of the surface of the disk-shaped object are reached.

23. Device for producing the drying gas for drying one or more disk-like objects, whereby said device is suitable for mixing a carrier gas and an active substance, wherein the device consists of a container with a first lower area to receive the active substance (3) and a second upper area (4) and wherein an opening (5) in container (1) is connected via a first line to a gas source (7) for the carrier gas and a second opening (8) is connected via a second line (9) to location (10) where the drying gas comes into contact with the surface of disk-like object (11), and wherein the two openings are located in second upper area (4) of the container (1).

24. Device according to claim 23, wherein there is a reducing valve (12) in the line between container (1) and location (10) where the drying gas comes into contact with the surface of disk-like object (11).

25. Device for drying disk-like objects with a rotating support (13) to receive a disk-like object (11), with a nozzle (14) for blowing the drying gas onto the surface of disk-like object (11), in which device nozzle (14) is connected via a line to a device according to one of claim 23 to produce the drying gas.

26. Device according to claim 25, wherein means are provided that are able to move nozzle (14) parallel to the surface of disk-shaped object (11), and with some distance between it and the surface of the object.

27. A process for production of a drying gas for drying one or more disk-like objects, comprising the steps of:

providing a container partially filled with an active substance in liquid form, the container having an inlet port and an outlet port, both the inlet port and the outlet port being located above a surface level of the active substance; and injecting a carrier gas into the inlet port so that the carrier gas comes into contact with the surface of the liquid active substance, thereby enriching the carrier gas with gas of the active substance;

wherein an entirety of the surface of the liquid active substance is still.

28. A process for drying disk-like objects comprising the steps of:

providing a container partially filled with an active substance in liquid form, the container having an inlet port and an outlet port, both the inlet port and the outlet port being located above a surface level of the active substance;

injecting a carrier gas into the inlet port so that the carrier gas comes into contact with the surface of the liquid active substance, thereby enriching the carrier gas with gas of the active substance, wherein an entirety of the surface of the liquid active substance is still;

spinning the disk-like object and blowing the enriched carrier gas received from the outlet port of the container onto a surface of the disk-like object while the disk-like object is spinning.

29. A device for drying at least one disk-like object comprising:

a container partially filled with an active substance in liquid form, the container having an inlet port and an outlet port, both the inlet port and the outlet port being located above a surface level of the active substance;

a carrier gas source connected to the inlet port of the container;

a nozzle connected to the outlet port of the container;

a rotating support for the disk-like object positioned so that the carrier gas enriched with the active substance blown by the nozzle is directed toward a surface of the disk-like object.

* * * * *